United States Patent [19]

Gauen

[11] Patent Number: 5,126,651
[45] Date of Patent: Jun. 30, 1992

[54] GATE DRIVE CIRCUIT FOR A SYNCHRONOUS RECTIFIER

[75] Inventor: Kim R. Gauen, Tempe, Ariz.

[73] Assignee: Motorola, Inc., Schaumburg, Ill.

[21] Appl. No.: 736,553

[22] Filed: Jul. 26, 1991

[51] Int. Cl.[5] .......................................... G05F 1/656
[52] U.S. Cl. ................................. 323/222; 323/224; 323/351; 363/127
[58] Field of Search ....................... 323/222, 224, 351; 363/127

[56] References Cited

U.S. PATENT DOCUMENTS

| 4,161,023 | 7/1979 | Goffeau | 323/224 |
| 4,672,303 | 6/1987 | Newton | 323/222 |
| 4,713,742 | 12/1987 | Parsley | 323/351 |
| 4,716,514 | 12/1987 | Patel | 363/127 |
| 4,737,902 | 4/1988 | Nakao et al. | 363/127 |
| 4,801,859 | 1/1989 | Dishner | 323/224 |
| 4,974,141 | 11/1990 | Severinsky et al. | 323/224 |
| 5,066,900 | 11/1991 | Bassett | 323/222 |

Primary Examiner—Steven L. Stephan
Assistant Examiner—Jeffrey L. Sterrett
Attorney, Agent, or Firm—Robert D. Atkins

[57] ABSTRACT

A voltage conversion circuit is responsive to a pulse-width modulated control signal for alternately enabling the gates of first and second field effect transistors which converts a high voltage input signal to a low voltage output signal. A first state of the control signal passes the high voltage input signal through the first transistor to charge a filter, while a second state of the control signal blocks the high voltage input signal from the filter. The second state of the control signal also sources current through the second transistor to the filter to rectify the low voltage output signal. The first and second transistors have non-overlapping conduction periods.

13 Claims, 1 Drawing Sheet

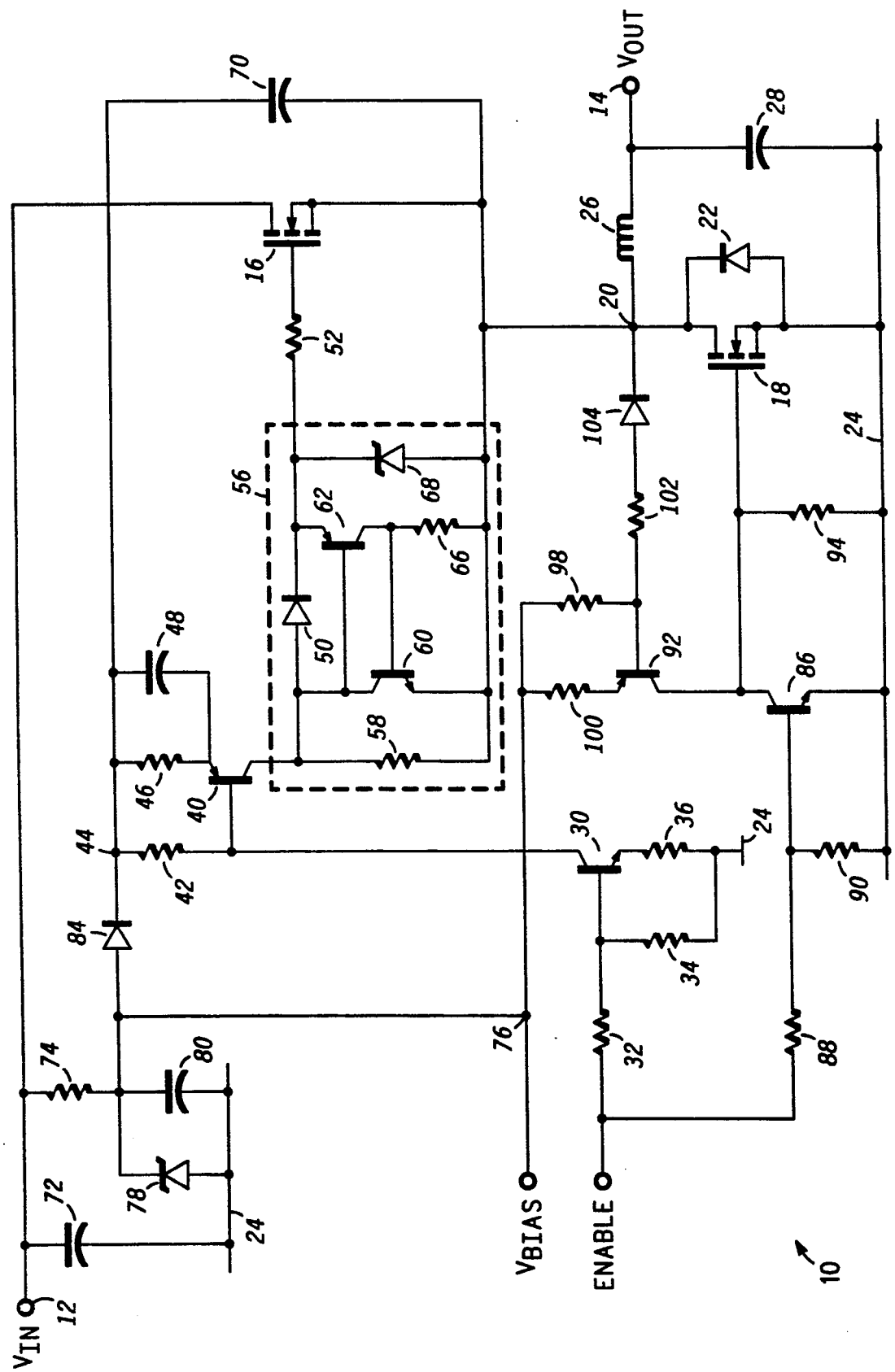

GATE DRIVE CIRCUIT FOR A SYNCHRONOUS RECTIFIER

BACKGROUND OF THE INVENTION

This invention relates in general to synchronous rectifiers and, more particularly, to a gate drive circuit for synchronous rectification.

Synchronous rectifiers are commonly used in power conversion systems for reducing a power supply voltage to a usable level. A DC-DC buck converter is one example of such an application, wherein a supply voltage, for example from an automobile battery, must be reduced to a level compatible with electronic components, say 5 VDC.

A conventional buck converter may comprise a field effect transistor (FET) and a low-pass filter serially coupled between a high voltage input terminal and a low voltage output terminal. A rectification diode is coupled between the interconnection of the FET and the low-pass filter and a negative power supply conductor. The gate of the FET is responsive to a pulse-width modulated control signal for passing the high voltage input signal to the rectification diode where it is rectified and low-pass filtered to provide the desired lower voltage output signal.

A principal problem with the aforedescribed conventional buck converter is the losses in the rectification diode due to its relative large forward voltage drop which reduces the efficiency of the voltage conversion. For example, a Schottky rectification diode may develop 400 millivolts of forward bias voltage which is significant compared to a 5 VDC output signal and may reduce the converter efficiency by as much as 8 percent.

Hence, what is needed is an improved synchronous rectifier for improving the efficiency of a power conversion system.

SUMMARY OF THE INVENTION

Briefly stated, the invention comprises a voltage conversion circuit responsive to an input signal for providing an output signal operating at a reduced voltage level comprising a first transistor having a drain coupled for receiving the input signal of the voltage conversion circuit, and a second transistor having a drain coupled to a source of the first transistor at a first node and a source coupled to a first source of operating potential. A filter is coupled to the first node for providing the output signal of the voltage conversion circuit. A first gate drive circuit has an output coupled to a gate of the first transistor and is responsive to a first state of a control signal for enabling the first transistor, while a second gate drive circuit has an output coupled to a gate of the second transistor and is responsive to a second state of the control signal for enabling the second transistor such that the first and second transistors have non-overlapping conduction periods.

In another aspect, the present invention is a method of converting an input voltage signal to an output voltage signal having a reduced voltage level comprising the steps of passing the input voltage signal through a first transistor to charge a filter in response to a first state of a control signal, blocking the input voltage signal from the filter in response to a second state of the control signal, and sourcing current through a second transistor to the filter in response to the second state of the control signal to rectify the output voltage signal such that the first and second transistors have non-overlapping conduction periods.

BRIEF DESCRIPTION OF THE DRAWING

The sole figure is a schematic diagram illustrating an embodiment of the present invention.

DETAILED DESCRIPTION OF THE PREFERRED EMBODIMENT

A voltage converter circuit 10 is shown in the sole figure operating as a DC-DC buck converter for stepping down a high voltage input signal $V_{IN}$, for example 30 VDC, applied at terminal 12 and providing a regulated low voltage output signal $V_{OUT}$, say 5 VDC, at terminal 14. Terminal 12 is coupled to the drain of field effect transistor 16 which includes a source coupled to the drain of field effect transistor 18 at node 20. An internal drain-source junction diode 22 is inherent for transistor 18. The source of transistor 18 is coupled to power supply conductor 24 operating at ground potential. A low-pass filter including inductor 26 and capacitor 28 is coupled between node 20 and output terminal 14.

The drive circuit for transistor 16 includes transistor 30 having a base coupled for receiving an ENABLE control signal applied through resistor 32. The base and emitter of transistor 30 are coupled through resistors 34 and 36 to power supply conductor 24, respectively. The collector of transistor 30 is coupled to the base of transistor 40 and through resistor 42 to node 44. The emitter of transistor 40 is coupled through a parallel combination of resistor 46 and capacitor 48 to node 44, while the collector of transistor 40 is coupled through diode 50 and resistor 52 to the gate of transistor 16.

Diode 50 operates as a current sensing device for gate discharge circuit 56 to remove the gate drive from transistor 16 when current stops flowing through diode 50. The anode of diode 50 is coupled through resistor 58 to node 20, to the collector of transistor 60 and to the base of transistor 62. The collector of transistor 62 is coupled to the base of transistor 60 and through resistor 66 to node 20, while the emitter of transistor 62 is coupled to the cathode of diode 50 and through zener diode 68 to node 20. Node 44 and node 20 are connected by capacitor 70 having a typical value of 0.47 microfarads.

The drive circuit for transistor 16 further includes capacitor 72 coupled between terminal 12 and power supply conductor 24, and resistor 74 coupled between terminal 12 and node 76. The parallel combination of zener diode 78 and capacitor 80 are coupled between node 76 and power supply conductor 24. The anode of diode 84 is coupled to node 76 and its cathode is coupled to node 44. A bias potential $V_{BIAS}$, say 12 VDC, is applied at node 76.

The drive circuit for transistor 18 includes transistor 86 having a base coupled for receiving the ENABLE control signal applied through resistor 88. The emitter and base of transistor 86 are coupled to power supply conductor 24, the latter path including resistor 90. The collector of transistor 86 is coupled to the gate of transistor 18, to the collector of transistor 92 and through resistor 94 to power supply conductor 24. Transistor 92 also receives the bias potential $V_{BIAS}$ at its base and emitter through resistors 98 and 100, respectively. The base of transistor 92 is also coupled through a serial combination of resistor 102 and diode 104 to node 20.

The operation of voltage converter circuit 10 proceeds as follows. The gate drive circuitry operating in response to the ENABLE control signal maintains synchronous non-overlapping conduction times for transistors 16 and 18. The ENABLE control signal is pulse-width modulated at 50 KHz with a 16% duty cycle (ideally $V_{OUT}/V_{In}$) for converting the 30 VDC input voltage to 5 VDC output signal at output terminal 14. The greater duty cycle (longer pulse width) of the ENABLE control signal, the higher the output voltage $V_{OUT}$.

First consider a high state of the ENABLE control signal turning on transistor 30, pulling the base of transistor 40 low and enabling a drive signal at the gate of transistor 16. Transistor 40 operates as a current source providing gate drive to transistor 16 limited by resistors 46 and 52. Capacitor 70 transfers charge from node 20 to node 44 to keep the gate voltage of transistor 16 above its source voltage. The high voltage $V_{IN}$ signal passes through transistor 16 and charges inductor 26 and capacitor 28. The high ENABLE control signal also turns on transistor 86 to pull the gate of transistor 18 low and disable its conduction path.

After a predetermined charge time for low-pass filter 26-28, the ENABLE signal drops low turning off transistors 30 and 40 and removing the gate drive from transistor 16. Discharge circuit 56 fires and sinks the gate charge from transistor 16 to node 20 when transistor 40 shuts off the current flow through diode 50. Since transistor 16 is off, inductor 26 immediately begins to draw current through the internal junction diode 22 of transistor 18, causing node 20 to be pulled low and enabling the conduction path through diode 104. Transistor 92 turns on from the low signal at node 20 and operates as a current source into resistor 94 and the input capacitance of transistor 18 for providing gate drive to transistor 18. Node 20 is latched at a low state by transistors 18 and 92. Transistor 86 is nonconductive due to the low ENABLE control signal.

As transistor 16 is shutting down there is a time period required for internal junction diode 22 to begin conducting and forward bias diode 104 which enables current source transistor 92 and turns on transistor 18. Discharge circuit 56 senses the absence of current flow through diode 50 and discharges the gate of transistor 16 before current source transistor 92 enables transistor 18. Thus, transistors 16 and 18 do not conduct simultaneously.

During the rectification phase of voltage converter circuit 10, the drain-to-source conduction path of transistor 18 supplies the current for inductor 26 with a much lower potential as compared to rectification diodes of the prior art. The drain-to-source junction voltage is typically only 200 millivolts due to the low $R_{DSON}$ (drain-to-source on resistance) of transistor 18. Junction diode 22 is effectively off since transistor 18 operates as a rectifier to conduct the current for inductor 26. The lower potential across transistor 18 improves the efficiency of voltage converter circuit 10 by reducing losses in the conversion process.

When the ENABLE signal returns to a high state, transistor 86 discharges the gate of transistor 18 turning it off, while at the same time turning on transistors 30 and 40 to again supply gate drive to transistor 16. The propagation delay through transistor 86 is less than the propagation delay through transistors 30 and 40 and diode 62 and resistor 64. Transistor 18 is assured to be off by the time transistor 16 begins to conduct. Again, transistors 16 and 18 do not conduct simultaneously.

A key feature of the present invention is the use of field effect transistor 18 with its internal drain-source junction diode which conducts at the beginning of the negative cycle to reduce the forward voltage drop across the rectifier and improve the efficiency of the voltage conversion process by reducing voltage losses. Transistor 18 is latched into conduction by a current source activated by the junction diode. The gate drive circuitry for transistors 16 and 18 maintain synchronous operation in response to a pulse-width modulated control signal to ensure the on-times of transistors 16 and 18 are non-overlapping.

Hence, what has been provided is a novel drive circuit for a rectification transistor in a voltage conversion circuit for reducing the forward voltage drop across the rectifier and improving the overall efficiency.

I claim:

1. A voltage conversion circuit responsive to an input signal for providing an output signal operating at a reduced voltage level at an output, comprising:
    a first transistor having a gate, a drain and a source, said drain being coupled for receiving the input signal of the voltage conversion circuit;
    a second transistor having a gate, a drain and a source, said drain being coupled to said source of said first transistor at a first node, said source being coupled to a first source of operating potential;
    a filter coupled to said first node for providing the output signal of the voltage conversion circuit;
    a first gate circuit having an output coupled to said gate of said first transistor, said first gate drive circuit being responsive to a first state of a control signal for enabling said first transistor; and
    a second gate drive circuit having an output coupled to said gate of said second transistor, said second gate drive circuit being responsive to a second state of said control signal for enabling said second transistor such that said first and second transistors have non-overlapping conduction periods, said second gate drive circuit including,
    (a) a third transistor having a base, an emitter and a collector, said emitter being coupled for receiving a bias potential applied at a second node, said collector being coupled to said gate of said second transistor for providing gate drive thereto,
    (b) a first diode having an anode coupled to said base of said third transistor and having a cathode coupled to said first node, and
    (c) a fourth transistor having a base, an emitter and a collector, said emitter being coupled to said first source of operating potential, said base being coupled for receiving said control signal, said collector being coupled to said gate of said second transistor to said collector of said third transistor.

2. The voltage conversion circuit of claim 1 wherein said first gate drive circuit includes:
    a fifth transistor having a base, an emitter and a collector, said base being coupled for receiving said control signal, said emitter being coupled to said first source of operating potential; and
    a sixth transistor having a base, an emitter and a collector, said base being coupled to said collector of said fifth transistor, said emitter being coupled to a third node, said collector being coupled to said gate of said first transistor for providing gate drive thereto.

3. The voltage conversion circuit of claim 2 wherein said first and second transistors are field effect transistors.

4. The voltage conversion circuit of claim 3 wherein said second gate drive circuit further includes:
- a first resistor coupled between said base of said fourth transistor and said first source of operating potential;
- a second resistor coupled between said collector of said third transistor and said first source of operating potential;
- a third resistor coupled between said emitter of said third transistor and said bias potential; and
- a fourth resistor serially coupled with said first diode between said base of said third transistor and said first node.

5. The voltage conversion circuit of claim 4 wherein said first gate drive circuit further includes:
- first means for discharging said gate of said first transistor upon sensing an absence of current flow thereto, said first means having a first terminal coupled to said collector of said sixth transistor and a second terminal coupled to said gate of said first transistor and a third terminal coupled to said first node;
- a fifth resistor coupled between said base of said sixth transistor and said third node;
- a sixth resistor coupled between said emitter of said sixth transistor and said third node;
- a first capacitor coupled between said emitter of said sixth transistor and said third node;
- a seventh resistor coupled between said second terminal of said first means and said gate of said first transistor;
- an eighth resistor coupled between said base of said fifth transistor and said first source of operating potential;
- a ninth resistor coupled between said emitter of said fifth transistor and said first source of operating potential; and
- a second capacitor coupled between said first node and second third node.

6. The voltage conversion circuit of claim 5 wherein said first gate drive circuit further includes:
- a third capacitor coupled between said drain of said first transistor and said first source of operating potential;
- a tenth resistor coupled between said drain of said first transistor and said second node;
- a zener diode coupled between said second node and said first source of operating potential; and
- a second diode having an anode coupled to said second node and having a cathode coupled to said third node.

7. The voltage conversion circuit of claim 6 wherein said filter includes:
- an inductor coupled between said first node and the output of the voltage conversion circuit; and
- a fourth capacitor coupled between the output of the voltage conversion circuit and said first source of operating potential.

8. A voltage conversion circuit responsive to an input signal for providing an output signal operating at a reduced voltage level at an output and including a first transistor having a drain coupled for receiving the input signal of the voltage conversion circuit, a second transistor having a drain coupled to a source of the first transistor at a first node and a source coupled to a first source of operating potential, and a filter coupled to the first node for providing the output signal of the voltage conversion circuit, said voltage conversion circuit comprising:
- a first gate drive circuit having an output coupled to the gate of the first transistor, said first gate drive circuit being responsive to a first state of a control signal for enabling said first transistor; and
- a second gate drive circuit having an output coupled to the gate of the second transistor, said second gate drive circuit being responsive to a second state of said control signal for enabling the second transistor such that the first and second transistors have non-overlapping conduction periods, said second gate drive circuit including,
  - (a) a third transistor having a base, an emitter and a collector, said emitter being coupled for receiving a bias potential applied at a second node, said collector being coupled to the gate of the second transistor for providing gate drive thereto,
  - (b) a first diode having an anode coupled to said base of said third transistor and having a cathode coupled to the first node, and
  - (c) a fourth transistor having a base, an emitter and a collector, said emitter being coupled to the first source of operating potential, said base being coupled for receiving said control signal, said collector being coupled to the gate of the second transmitter and to said collector of said third transistor.

9. The voltage conversion of claim 8 wherein said first gate drive circuit includes:
- a fifth transistor having a base, an emitter and a collector, said base being coupled for receiving said control signal, said emitter being coupled to the first source of operating potential; and
- a sixth transistor having a base, an emitter and a collector, said base being coupled to said collector of said fifth transistor, said emitter being coupled to a third node, said collector being coupled to the gate of the first transistor for providing gate drive thereto.

10. The voltage conversion circuit of claim 9 wherein the first and second transistors are field effect transistors.

11. The voltage conversion circuit of claim 10 wherein said second gate drive circuit further includes:
- a first resistor coupled between said base of said fourth transistor and the first source of operating potential;
- a second resistor coupled between said collector of said third transistor and the first source of operating potential;
- a third resistor coupled between said emitter of said third transistor and said bias potential; and
- a fourth resistor serially coupled with said first diode between said base of said third transistor and the first node.

12. The voltage conversion circuit of claim 11 wherein said first gate drive circuit further includes:
- first means for discharging the gate of the first transistor upon sensing an absence of current flow thereto, said first means having a first terminal coupled to said collector of said sixth transistor and a second terminal coupled to the gate of the first transistor and a third terminal coupled to the first node;
- a fifth resistor coupled between said base of said sixth transistor and said third node;

a sixth resistor coupled between said emitter of said sixth transistor and said third node;

a first capacitor coupled between said emitter of said sixth transistor and said third node;

a seventh resistor coupled between said second terminal of said first means and the gate of the first transistor;

an eighth resistor coupled between said base of said fifth transistor and the first source of operating potential;

a ninth resistor coupled between said emitter of said fifth transistor and the first source of operating potential; and a second capacitor coupled between the first node and said third node.

13. The voltage conversion circuit of claim 12 wherein said first gate drive circuit further includes:

a third capacitor coupled between the drain of the first transistor and the first source of operating potential;

a tenth resistor coupled between the drain of the first transistor and said second node;

a zener diode coupled between said second node and the first source of operating potential; and a second diode having an anode coupled to said second node and having a cathode coupled to said third node.

* * * * *

UNITED STATES PATENT AND TRADEMARK OFFICE
CERTIFICATE OF CORRECTION

PATENT NO. : 5,126,651

DATED : June 30, 1992

INVENTOR(S) : Kim R. Gauen

It is certified that error appears in the above-identified patent and that said Letters Patent is hereby corrected as shown below:

In column 4, line 30, claim 1, please insert --drive-- after the word "gate" and before the word "circuit".

In column 6, line 28, claim 8, please delete the word "transmitter" and insert the word --transistor--.

Signed and Sealed this

Fifth Day of October, 1993

*Attest:*

BRUCE LEHMAN

*Attesting Officer*     Commissioner of Patents and Trademarks